US012787288B2

(12) United States Patent
Luo et al.

(10) Patent No.: US 12,787,288 B2
(45) Date of Patent: Nov. 3, 2026

(54) MEMORY CIRCUITRY AND METHODS USED IN FORMING MEMORY CIRCUITRY

(71) Applicant: Micron Technology, Inc., Boise, ID (US)

(72) Inventors: Shuangqiang Luo, Boise, ID (US); Indra V. Chary, Boise, ID (US); Kar Wui Thong, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 377 days.

(21) Appl. No.: 18/602,321

(22) Filed: Mar. 12, 2024

(65) Prior Publication Data

US 2024/0341095 A1 Oct. 10, 2024

Related U.S. Application Data

(60) Provisional application No. 63/457,877, filed on Apr. 7, 2023.

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ................................ H10B 43/27; H10B 41/27
See application file for complete search history.

(56) References Cited

U.S. PATENT DOCUMENTS

| | | | | |
|---|---|---|---|---|
| 10,290,652 | B1 * | 5/2019 | Sharangpani .......... | H10B 41/27 |
| 10,658,377 | B2 * | 5/2020 | Kubo ..................... | H10B 43/27 |
| 12,082,409 | B2 * | 9/2024 | Hopkins ................ | H10B 43/27 |
| 2022/0199637 | A1 | 6/2022 | Luo et al. | |

* cited by examiner

*Primary Examiner* — Dale E Page
*Assistant Examiner* — Wilner Jean Baptiste
(74) *Attorney, Agent, or Firm* — Wells St. John P.S.

(57) ABSTRACT

Memory circuitry comprising strings of memory cells comprises vertically-alternating insulative tiers and conductive tiers that extend from a memory-array region into a stair-step region across an intermediate region that is between the memory-array region and the stair-step region. The insulative tiers and the conductive tiers comprise memory blocks upper portions of which individually comprise sub-blocks. Sub-block trenches are in the upper portions individually between immediately-laterally-adjacent of the sub-blocks. Strings of memory cells in the memory-array region comprise channel-material strings that extend through the insulative tiers and the conductive tiers in the memory blocks and in the sub-blocks. The sub-block trenches in the memory-array region, in the intermediate region, and in the stair-step region individually have a top. The top of individual of the sub-block trenches in the stair-step region has a narrowest-width that is larger than a narrowest-width of the top of the individual sub-block trenches in the intermediate region. The narrowest-width of the top of the individual sub-block trenches in the intermediate region is larger than a narrowest-width of the top of the individual sub-block trenches in the memory-array region. Other embodiments, including method, are disclosed.

36 Claims, 12 Drawing Sheets

FIG. 6

MEMORY CIRCUITRY AND METHODS USED IN FORMING MEMORY CIRCUITRY

TECHNICAL FIELD

Embodiments disclosed herein pertain to memory circuitry and to methods used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
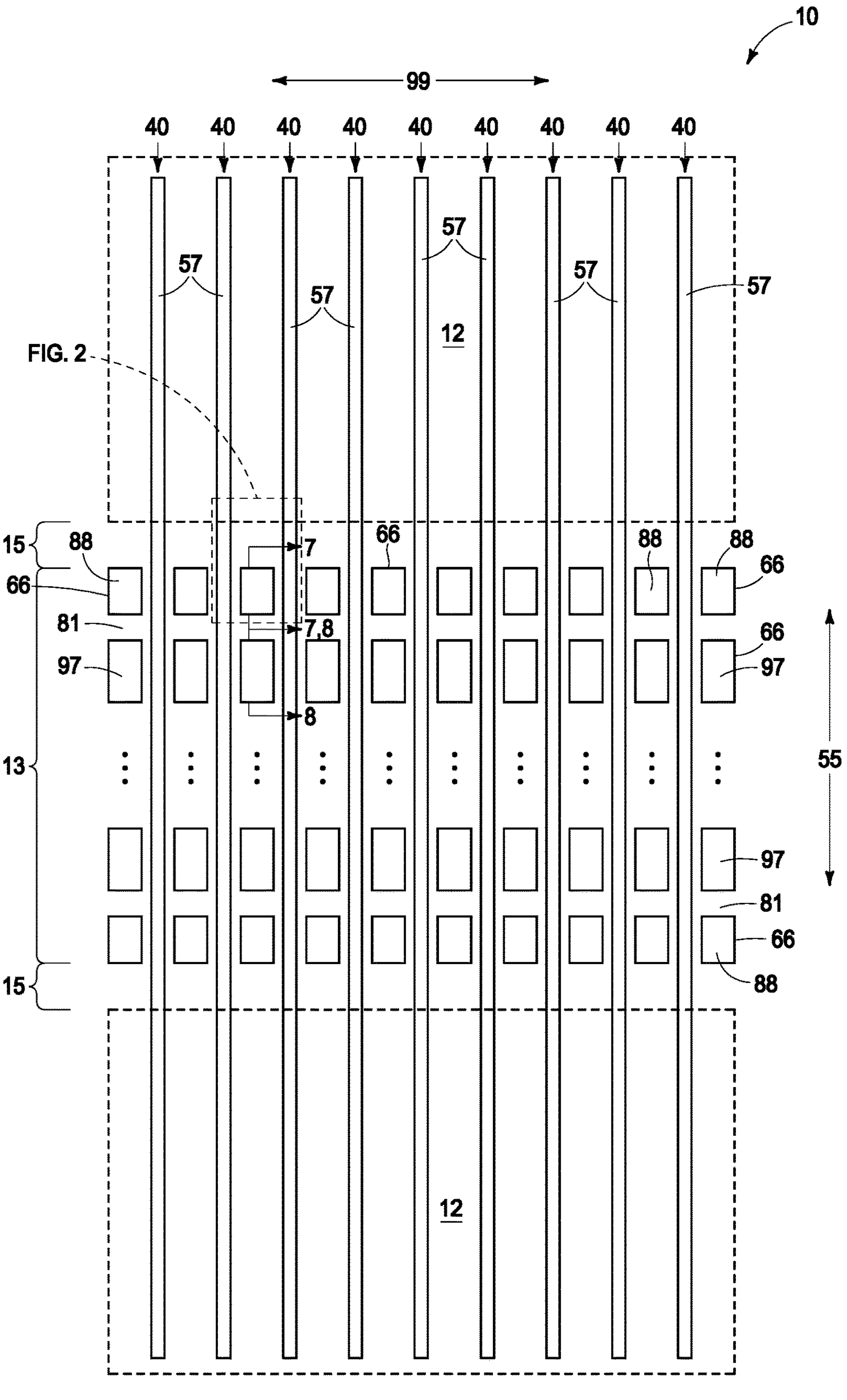
FIG. 1 is a diagrammatic view of a portion of memory circuitry in process in accordance with embodiments of the invention.
Figure 2:
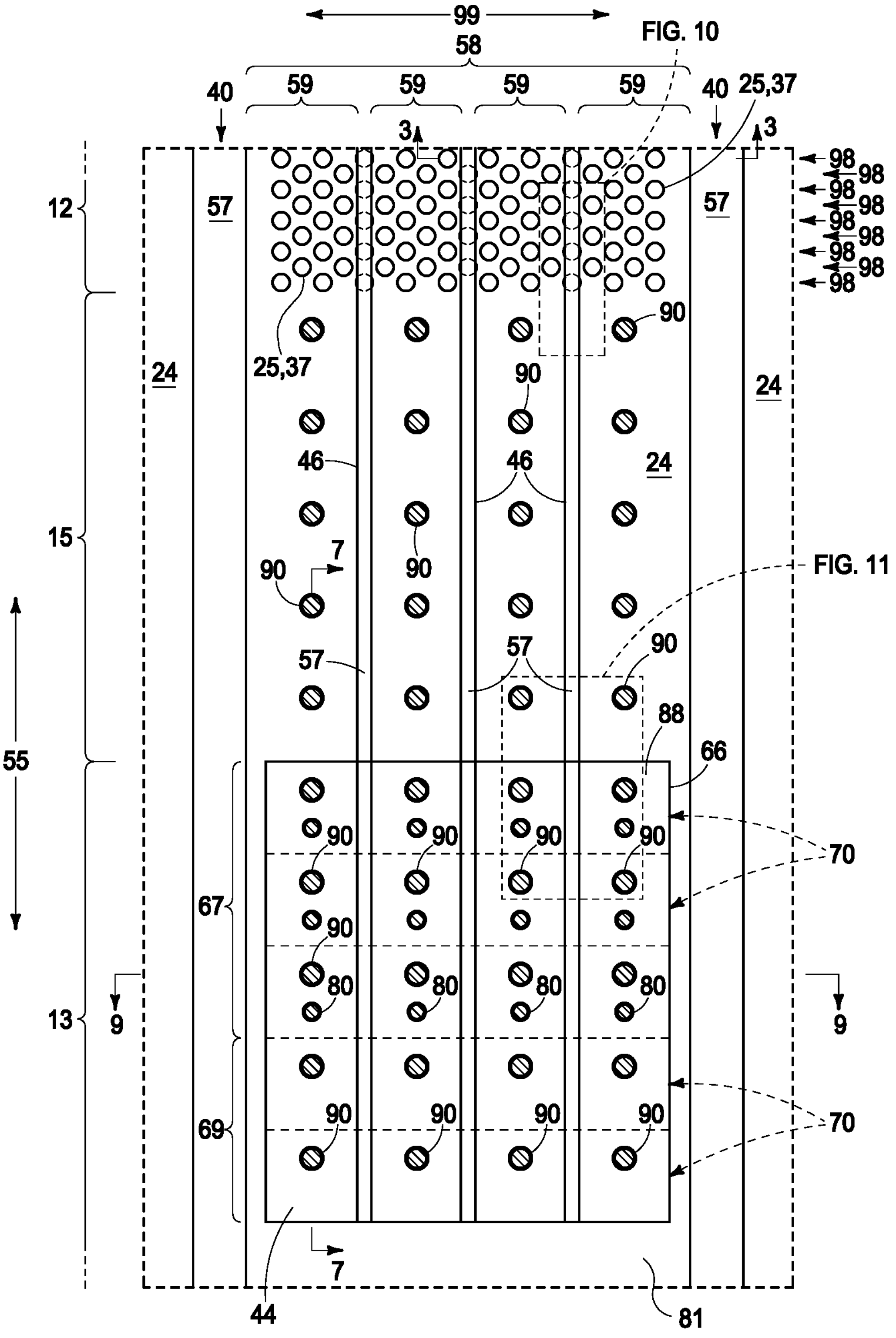
FIGS. 2-16 are diagrammatic sectional, expanded, enlarged, and/or partial views of the construction of FIG. 1 or portions thereof, and/or of alternate embodiments.
Figure 3:
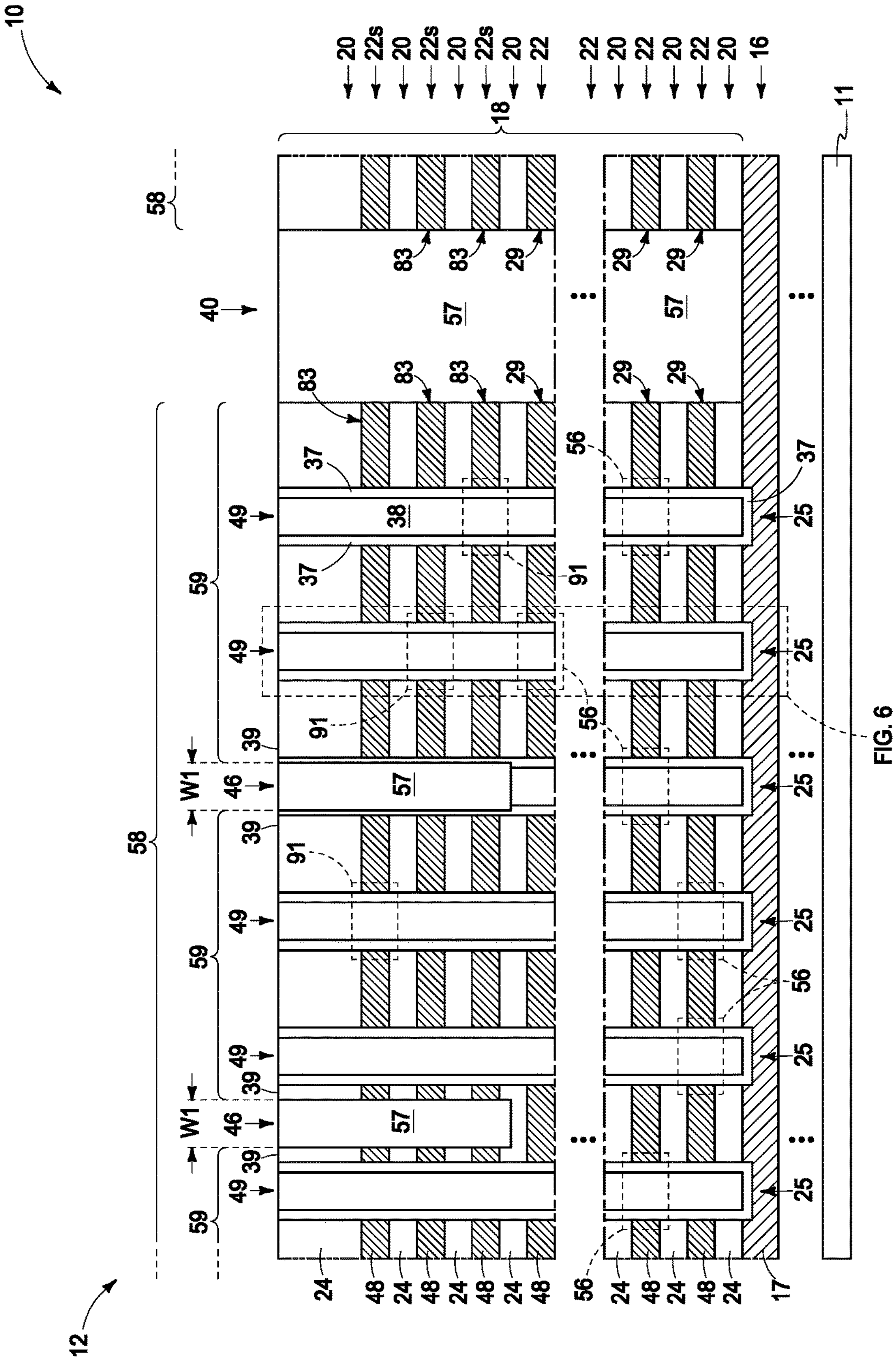

Embodiments of the invention encompass methods used in forming memory circuitry, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass memory circuitry (e.g., NAND architecture) independent of method of manufacture. An example embodiment of such memory circuitry is described with reference to FIGS. 1-11.

FIGS. 1-11 show an example construction 10 (e.g., memory circuitry 10) having two memory-array regions 12 comprising strings 49 of transistors and/or memory cells 56 (e.g., comprising NAND). The two memory-array regions 12 may be of the same or different construction(s) relative one another. Construction 10 may comprise only a single memory-array region 12 or may comprise more than two memory-array regions 12 (neither being shown). In one embodiment, a stair-step region 13 is between memory-array regions 12 and comprises stair-step structures as described below. An intermediate region 15 is between individual memory-array regions 12 and stair-step region 13. Alternately, by way of example, a stair-step region may be at the end of a single memory-array region (not shown). FIGS. 2-11 are of different respective scales compared to FIG. 1 (and in some instances to each other).

Example memory circuitry 10 comprises a base substrate 11. Such may comprise any one or more of conductive/conductor/conducting, semiconductive/semiconductor/semiconducting, or insulative/insulator/insulating (i.e., electrically herein) materials. Various materials are above base substrate 11. Materials may be aside, elevationally inward, or elevationally outward of the FIGS. 1-11-depicted materials. For example, other partially or wholly fabricated components of integrated circuitry may be provided somewhere above, about, or within base substrate 11. Control and/or other peripheral circuitry for operating components within an array (e.g., individual array regions 12) such as strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array. A conductor tier 16 comprising conductor material 17 (e.g., conductively-doped polysilicon atop $WSi_x$) has been formed above substrate 11. Conductor tier 16 may comprise part of control circuitry (e.g., peripheral-under-array circuitry and/or a common source line or plate) used to control read and write access to the transistors and/or memory cells that will be formed within array 12.

A stack 18 comprising vertically-alternating insulative tiers 20 and conductive tiers 22* is above conductor tier 16 (an * being used as a suffix to be inclusive of all such same-numerically-designated components that may or may not have other suffixes). Tiers 20 and 22* extend from memory-array region 12 into stair-step region 13 across intermediate region 15. Example thickness for each of tiers 20 and 22* is 20 to 60 nanometers. The example uppermost tier 20 may be thicker/thickest compared to one or more other tiers 20 and/or 22*. Only a small number of tiers 20 and 22* is shown, with more likely stack 18 comprising dozens, a hundred or more, etc. of tiers 20 and 22*. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22* and/or above an uppermost of conductive tiers 22*. For example, one or more select gate tiers (not shown) may be between conductor tier 16 and the lowest conductive tier 22*. Example insulative tiers 20 comprise insulative material 24 (e.g., silicon dioxide and/or other material that may be of one or more composition(s)).

Insulative tiers 20 and conductive tiers 22* comprise memory blocks 58, with an upper portion of individual memory blocks 58 (e.g., the uppermost portion thereof) comprising sub-blocks 59. Sub-blocks 59 are not shown in FIG. 1 due to scale and for clarity. Memory blocks 58 and sub-blocks 59 may be considered as being longitudinally elongated and oriented, for example along a direction 55. Conductive tiers 22* of sub-blocks 59 individually comprise select-gate tiers **22*s*. For brevity, only three select-gate tiers 22*s* are shown and there may be more or fewer than three select-gate tiers 22*s* (not shown). Example memory blocks 58 are shown as at least in part being defined by horizontally-elongated trenches 40. Such may have respective bottoms that are directly against conductor material 17 (e.g., atop or within) of conductor tier 16 (as shown) or may have respective bottoms that are above conductor material 17 of conductor tier 16 (not shown). Sub-block trenches 46 are in the upper portion of memory blocks 58 (not shown in FIG. 1) and are individually between immediately-laterally-adjacent sub-blocks 59 (i.e., there being no other sub-block between those that are immediately-laterally-adjacent one another). Sub-block trenches 46 individually extend through and are horizontally-along select-gate tiers 22*s* and insulative tiers 20 of sub-blocks 59 (ideally no deeper than into insulative material 24 that is below the lowest select gate tier 22*s*). The upper portion of stack 18 comprising sub-block trenches 46 may be formed at the same time or at a different time as that portion of stack 18** there-below is formed.

By way of example only, four sub-blocks 59 are shown in each memory block 58 although more or fewer sub-blocks may be in each and not all memory blocks need have the same number of sub-blocks. Trenches 40 and/or sub-block trenches 46 may taper laterally-inward and/or laterally-outward (not shown) moving deeper in stack 18. Trenches 40 and/or sub-block trenches 46 may have constant width or variable width (i.e., straight-line horizontally and between opposing lateral sidewalls thereof) at any elevation (i.e., at their respective top, bottom, and/or somewhere vertically there-between). Along direction 55, trenches 40 and/or sub-block trenches 46 may be longitudinally straight, be curvilinear, have a combination of angled straight segments, have a combination of straight and curved segments, etc. Example insulating material 57 (e.g., silicon dioxide, silicon nitride, and/or aluminum oxide) is in trenches 40 and sub-block trenches 46. Such provides lateral electrical isolation (insulation) between immediately-laterally-adjacent memory blocks 58 and between immediately-laterally-adjacent sub-blocks 59. Insulating material 57 may include through-array-vias (TAVs, not shown). Insulating material 57 may be formed in trenches 46 and 40 at the same or different time(s) and if at different times may be of the same or different composition(s) in sub-block trenches 46 compared to trenches 40.

Example channel openings 25 extend through insulative tiers 20 and conductive tiers 22* to conductor tier 16. Channel openings 25 may taper radially-inward and/or radially-outward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired. By way of example and for brevity only, channel openings 25 are shown as being arranged in groups or columns of staggered rows 98 of nine and ten openings 25 per row in memory blocks 58 and in staggered rows of two openings 25 per row in sub-blocks 59. Any alternate existing or future-developed arrangement and construction may be used.

Transistor channel material is in the individual channel openings elevationally along the insulative tiers and the conductive tiers, thus comprising individual channel-material strings, which is directly electrically coupled with conductive material in the conductor tier. Individual memory cells of the example memory array may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

Figure 4:
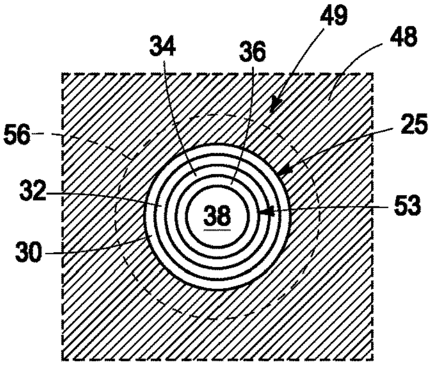
Figure 5:
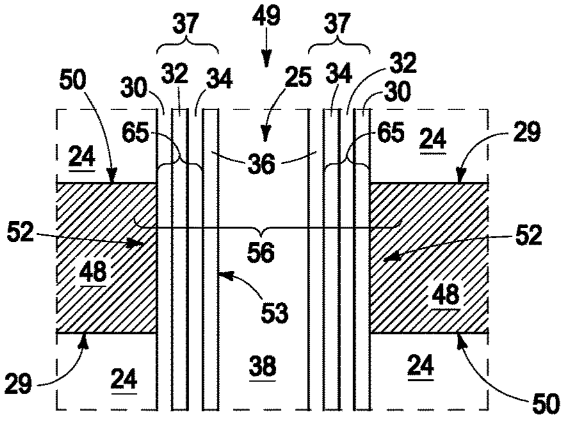
Figure 6:
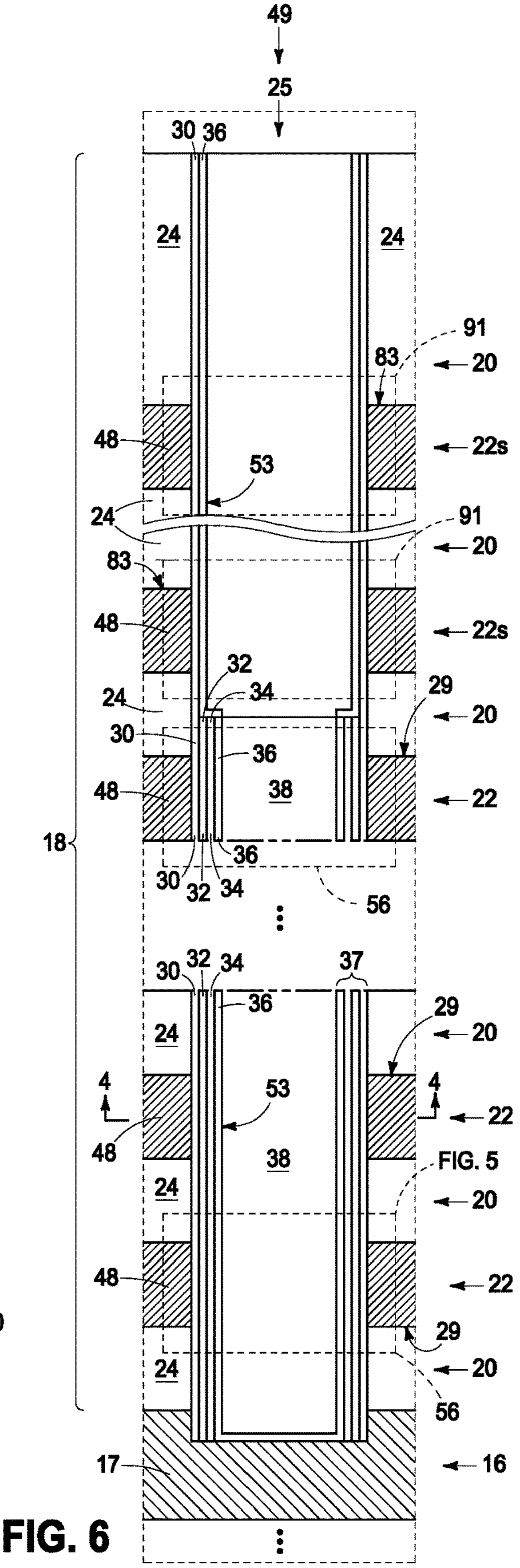
Figure 7:
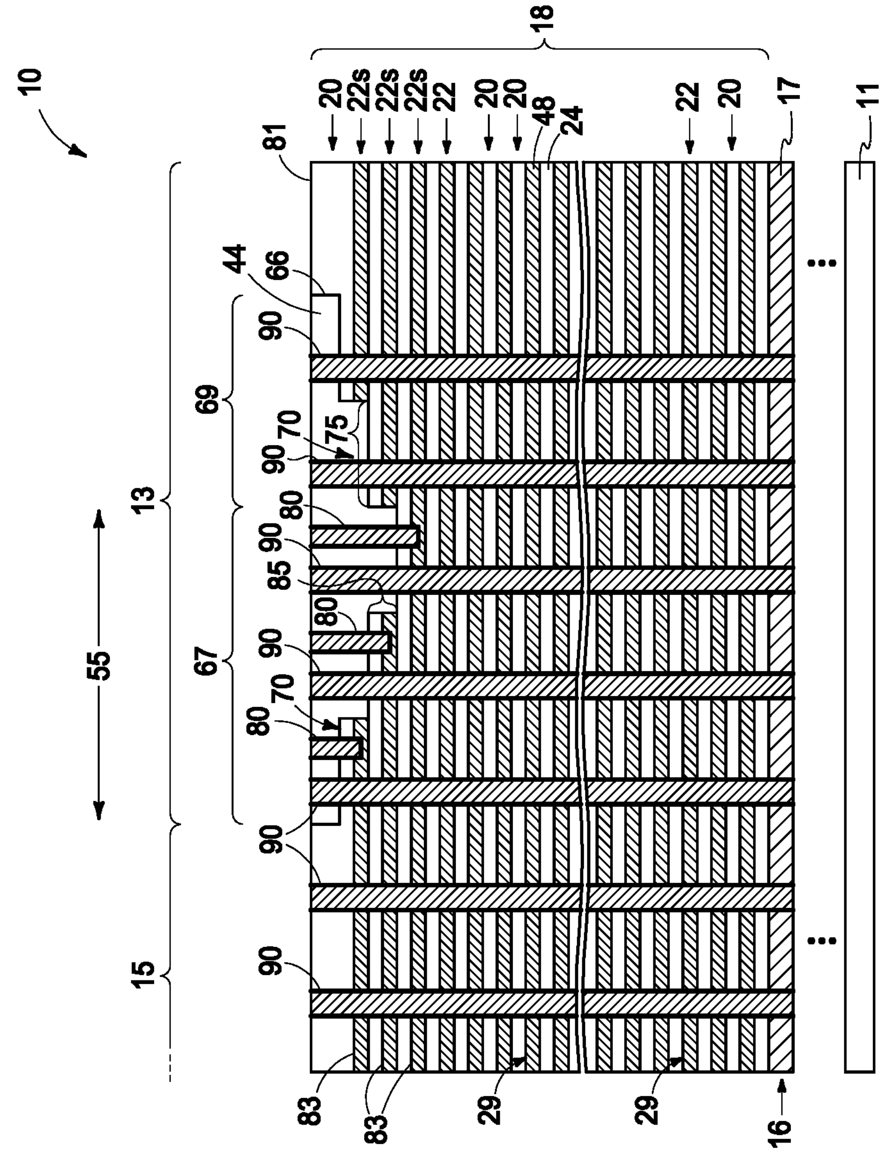
Figure 8:
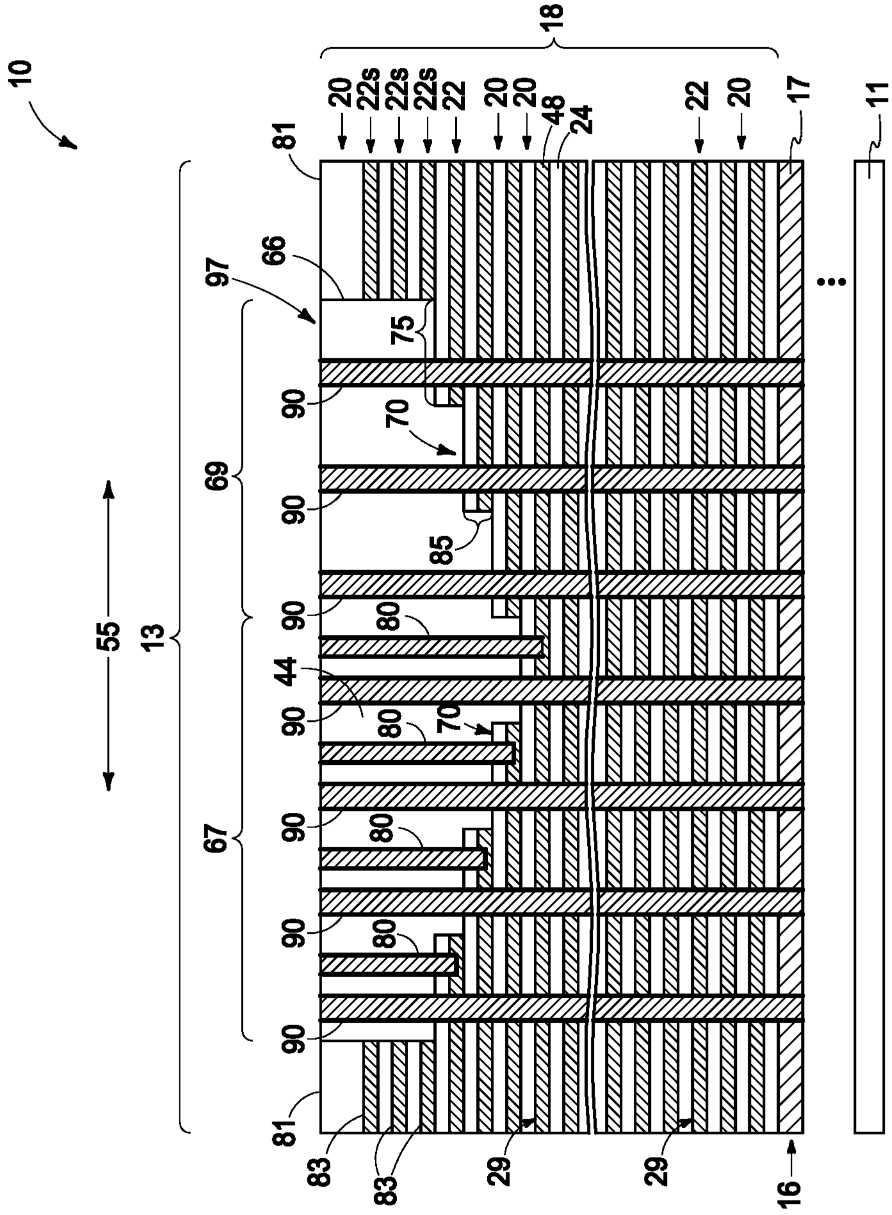
Figure 9:
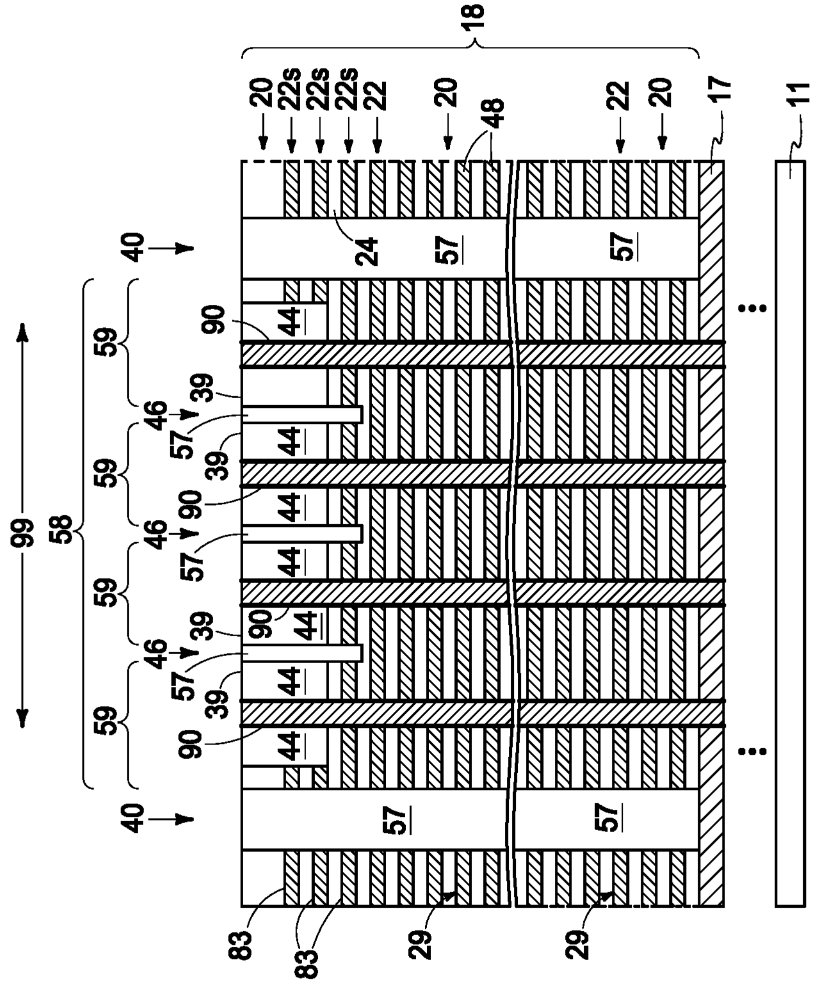
Figure 11:
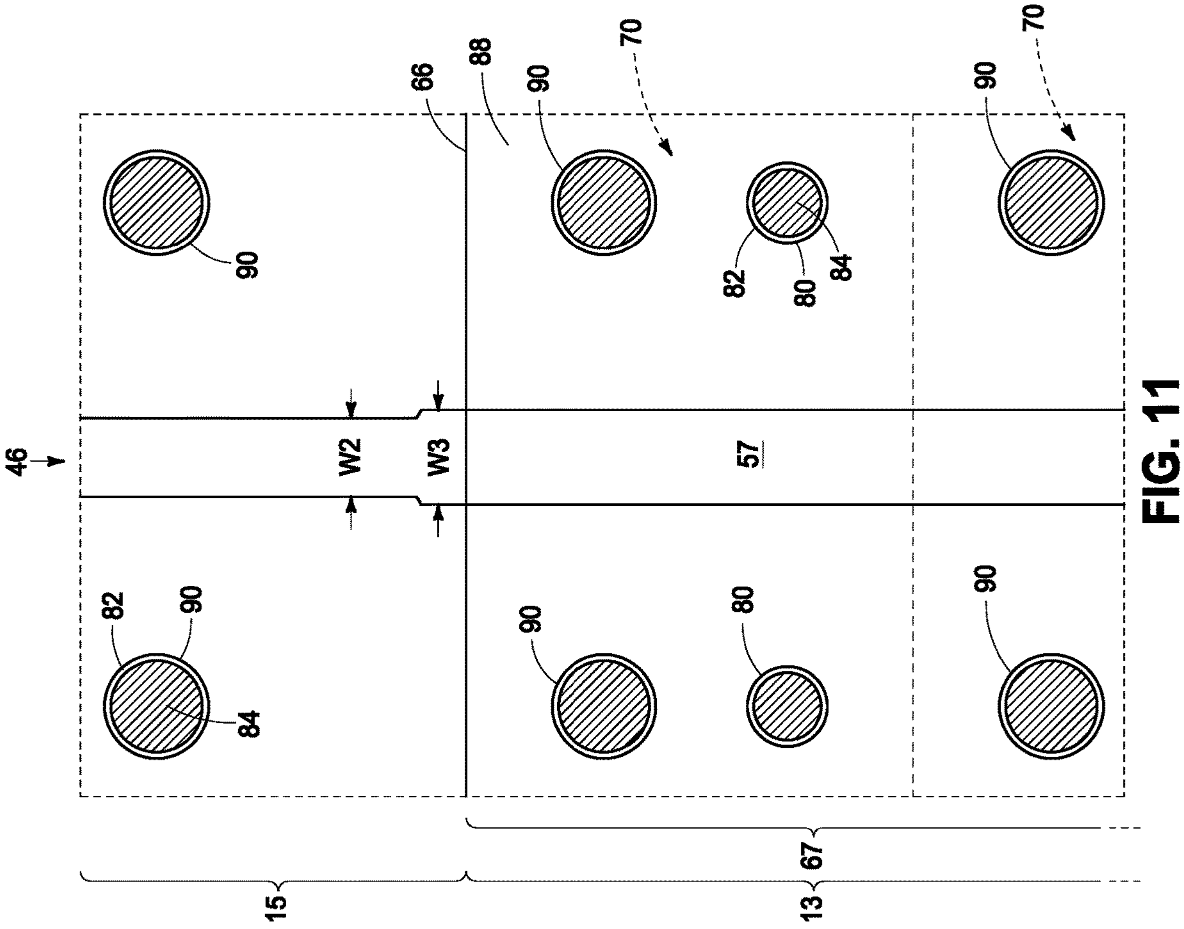
Figure 10:
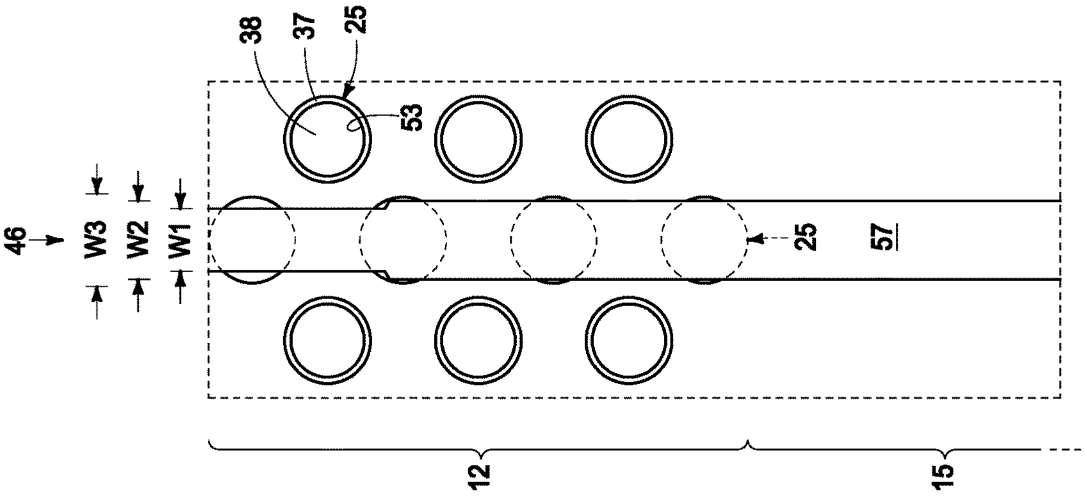
Figure 12:
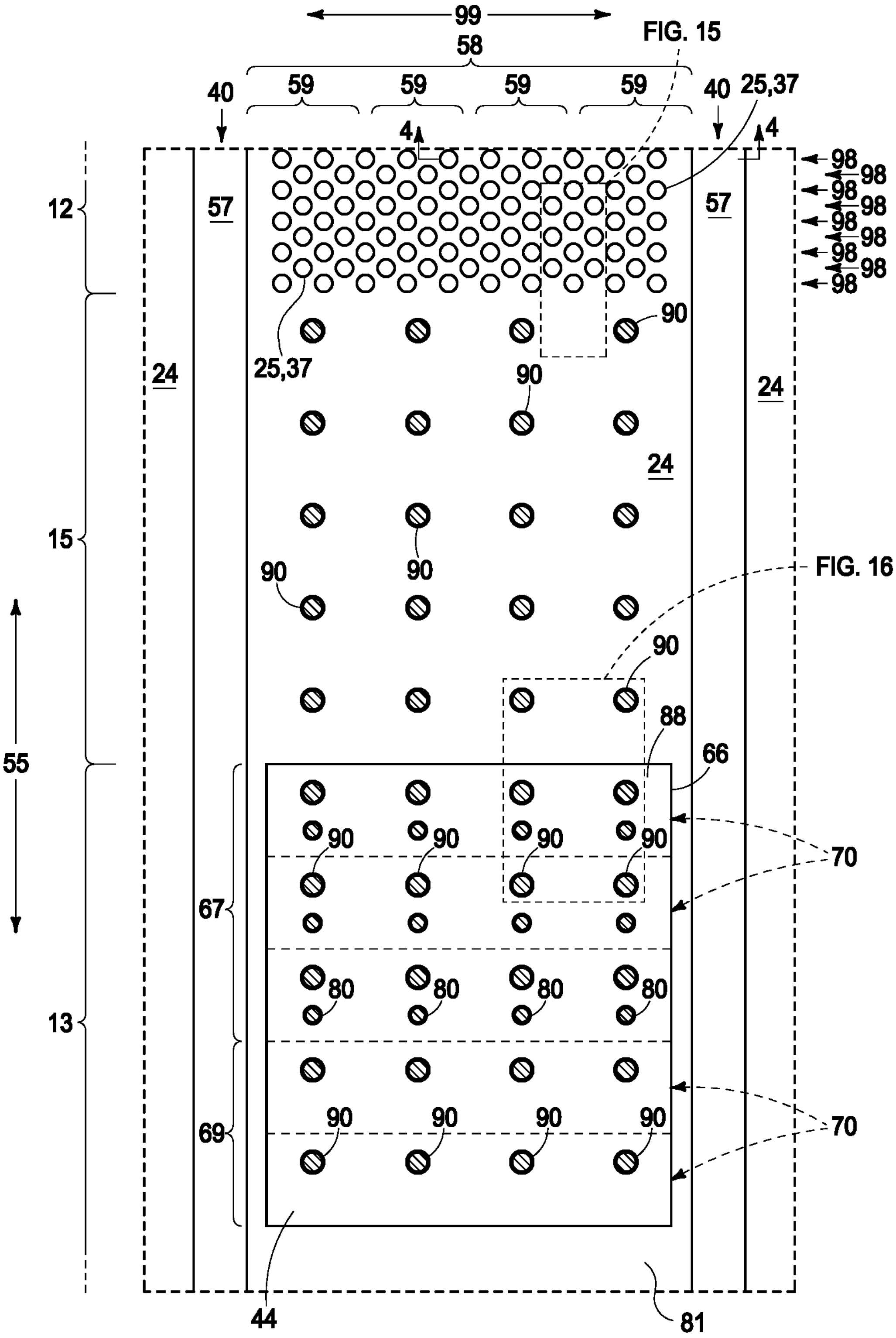
Figure 13:
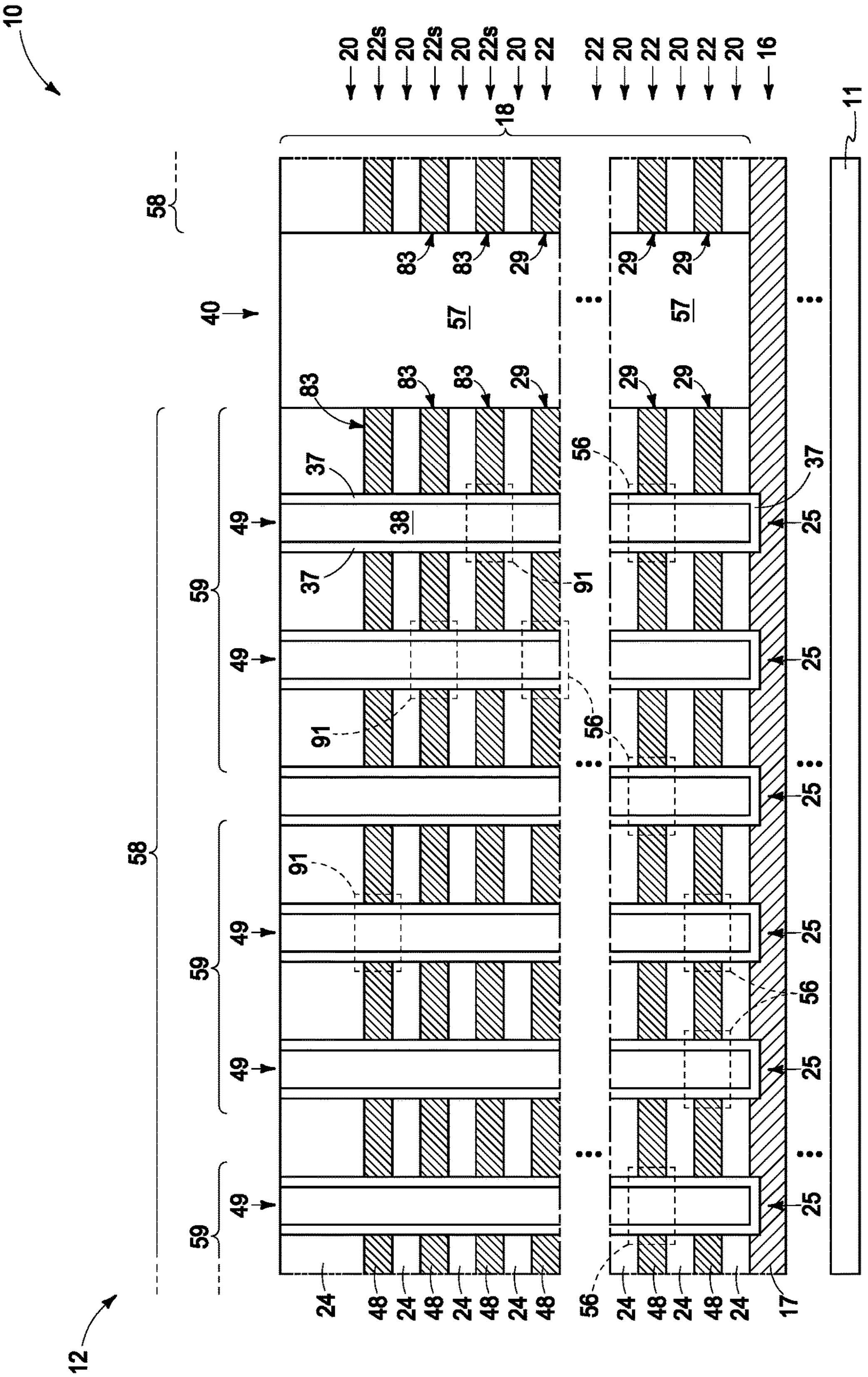
Figure 14:
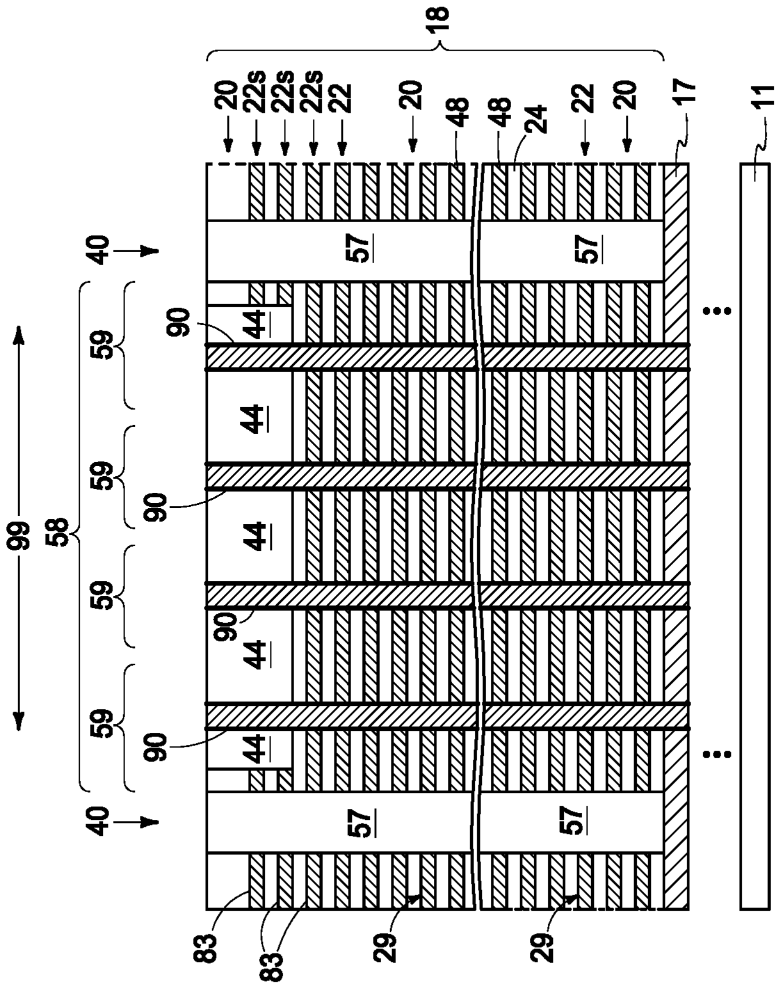
Figure 16:
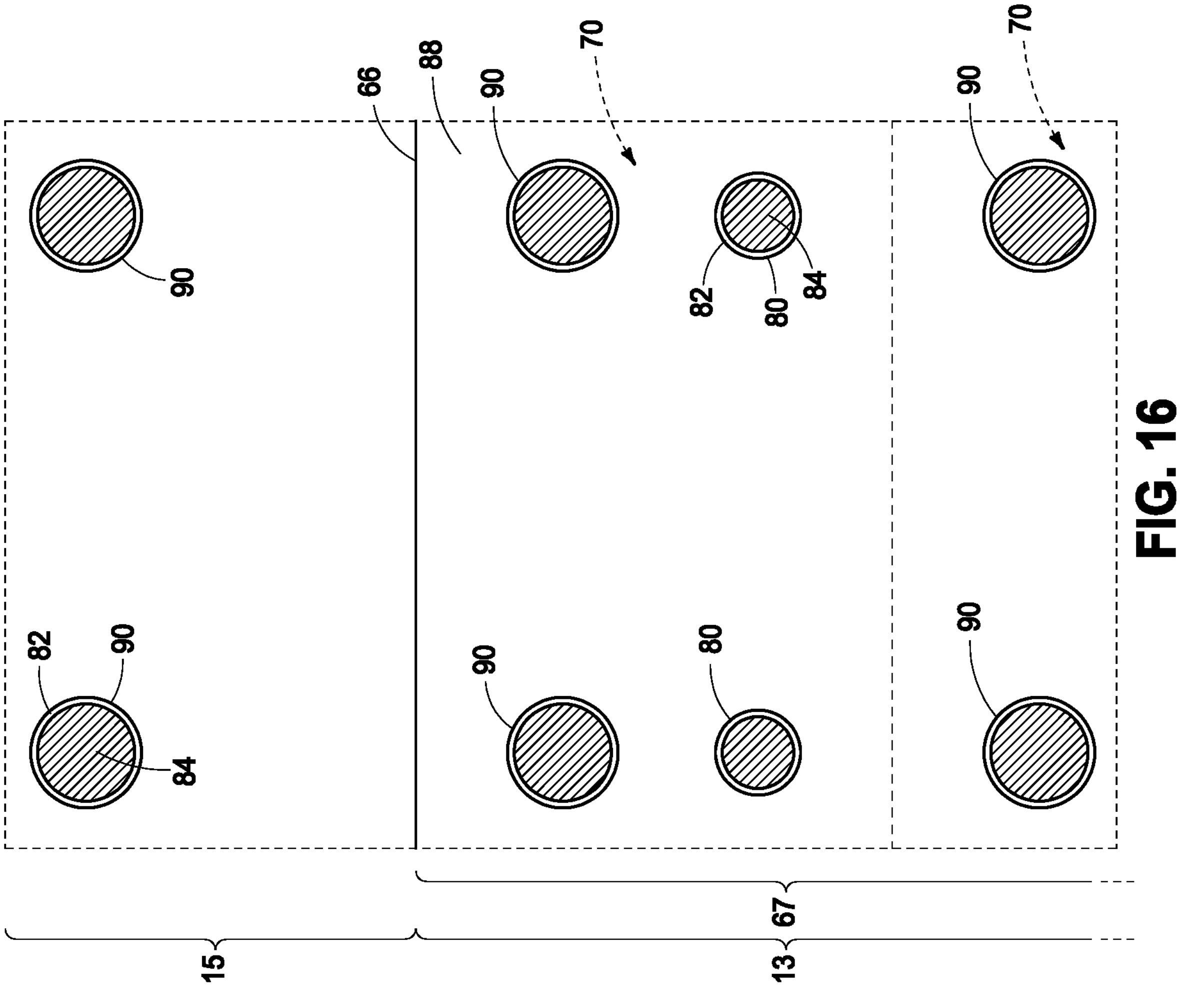
Figure 15:
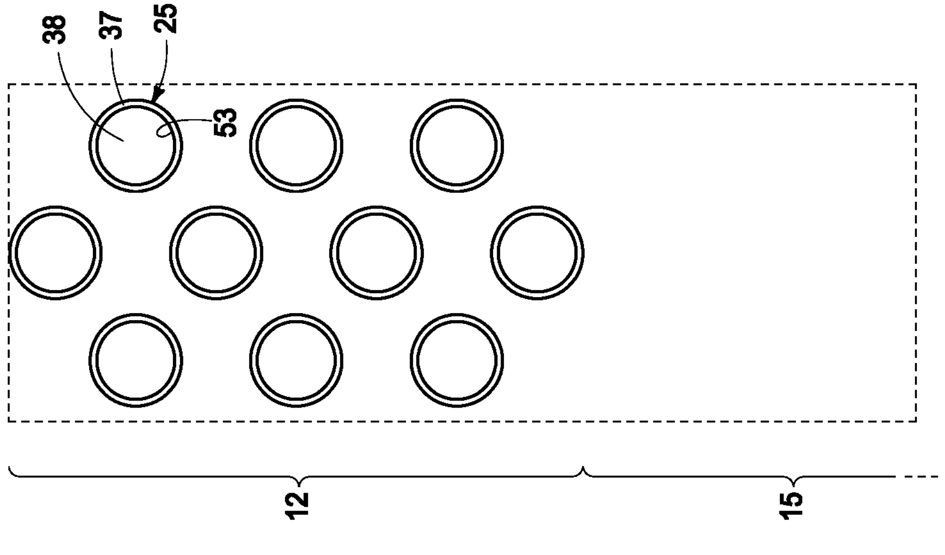

FIGS. 4-6 show one embodiment wherein charge-blocking material 30, storage material 32, and charge-passage material 34 have been formed in individual channel openings 25 elevationally along insulative tiers 20 and conductive tiers 22*. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18.

Channel material 36 has also been formed in channel openings 25 elevationally along insulative tiers 20 and conductive tiers 22* and comprises individual channel-material strings 53, in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in some figures due to scale. Channel-material strings 53 may also be below sub-block trenches 46 (as shown) and may be dummy (inoperative). Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Channel-material strings 53 extend through insulative tiers 20 and conductive tiers 22* in memory blocks 58 and sub-blocks 59. Channel material 36 of channel-material strings 53 in sub-blocks 59 may be formed at the same or at different time(s) relative to the tiers that are below sub-blocks 59. Further, a conductive plug (e.g., conductively-doped polysilicon and not shown) may interconnect channel material 36 in sub-blocks 59 with channel material 36 therebelow and thereby comprise part of individual channel-material strings 53.

Example conductive tiers 22* comprise conducting material 48 that is part of individual conductive lines 29 (e.g., wordlines) that are also part of elevationally-extending strings 49 of individual transistors and/or memory cells 56. Conducting material 48 also comprises individual select gates 83 in individual select-gate tiers **22*s* of individual select-gate transistors 91. Select gate transistors 91 may (not shown) or may not (ideally, and as shown) comprise materials 32 and 34, yet will have some gate insulator 30 regardless of when formed and regardless of whether being of the same or different composition(s) as that of memory cells/transistors 56. Two or more of select gates 83** may be directly electrically coupled, or otherwise electrically coupled, relative one another (not shown).

A thin insulative liner (e.g., $Al_2O_3$ and not shown) may be formed before forming conducting material 48. Approximate locations of transistors and/or memory cells 56 are indicated with a bracket in some figures and some with dashed outlines in some figures, with transistors and/or memory cells 56 being essentially ring-like or annular in the depicted example (likewise with select-gate transistors 91). Alternately, transistors and/or memory cells 56 (and/or select-gate transistors 91) may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Stair-step structures 88 and 97 are in stair-step region 13 (e.g., individually within a cavity 66), with example stair-step structures 88 individually comprising a select-gate-drain (SGD) stair-step structure and stair-step structures 97 comprising non-SGD stair-step structures (i.e., that do not include any operative SGD[s]). Alternately, by way of example, stair-step structure 88 may contain both SGD gates and non-SGD gates (not shown). Example cavities 66 are aligned longitudinally end-to-end in individual memory blocks 58 and have a crest 81 between immediately-adjacent cavities 66 (e.g., cavities 66 being spaced relative one another in first direction 55 by crests 81). Cavities 66 are shown as being rectangular in horizontal cross-section, although other shape(s) may be used and all need not be of the same size and/or shape relative one another. Cavities 66 may taper laterally-inward and/or laterally-outward moving deeper into stack 18 (neither being shown).

Example SGD stair-step structure 88 comprises a flight 67 or 69 of stairs 70 extending along first direction 55. Flights 67 and 69 with a landing there-between may be considered as comprising a stair-step structure (the landing may be considered as part of either flight 67 and/or 69). Example non-SGD stair-step structures 97 also comprise a flight 67 or 69 of stairs 70 extending along first direction 55, with emphasis in this disclosure being with respect to example stair-step structure 88. Example flights 67 and 69 oppose one another in cavity 66 and individual stairs 70 comprise a tread 75 and a riser 85. Individual treads 75 comprise one (at least one) of conductive tiers 22*. Cavities 66 with flights 67 and 69 may be formed by any existing or later-developed method(s). As one such example, a masking material (e.g., a photo-imagable material such as photoresist) may be formed atop stack 18 and an opening formed there-through. Then, the masking material may be used as a mask while etching (e.g., anisotropically) through the opening to extend such opening into at least two outermost two tiers 20, 22*. The resultant construction may then be subjected to a successive alternating series of lateral-trimming etches of the masking material followed by etching deeper into stack 18, at least two tiers 20, 22* at a time, using the trimmed masking material having a successively widened opening as a mask. Such an example may result in the forming of flight 67 into stack 18 that comprises vertically-alternating tiers 20, 22* of different composition materials, and in the forming of another flight 69 opposite and facing flight 67 (e.g., in mirror-image and as shown). In replacement-gate processing, such may occur with respect to a sacrificial material (not shown) in conductive tiers 22* which is then etched away and replaced with conducting material 48 through trenches 40. More or less stairs 70 may be in flights 67 and/or 69 than shown. Example stairs 70 in stack 18 are individually shown as comprising one conductive tier 22* and one insulative tier 20 (the order of which may be reversed and not shown). More conductive and insulative tiers per stair 70 may be used, for example if forming multiple treads per stair (e.g., along a second direction 99 and not shown). Further, horizontal depth of treads 75 in direction 55 and vertical height of risers 85 may be equal or different relative one another. Flights 67 and/or 69 in cavities 66 may be translated (etched) deeper into stack 18 together and/or while one of flights 67 or 69 is masked depending on the circuitry being fabricated.

In one example, one of two opposing flights 67 and 69 is operative (e.g., flight 67) and the other of two opposing flights 67 and 69 is dummy (e.g., flight 69). In this document, a flight that is "dummy" is circuit-inoperative having stairs thereof in which no current flows in conductive material of the steps and which may be a circuit-inoperable dead end that is not part of a current flow path of a circuit even if extending to or from an electronic component. When inoperative, position of operative vs. inoperative relative to flights 67 and 69 may of course be reversed. Multiple operative flights and multiple dummy flights may be formed in multiple cavities 66, for example longitudinally end-to-end as shown and to different depths within stack 18. Pairs of opposing mirror-image flights 67, 69 may be considered as defining a stadium (e.g., a vertically recessed portion having opposing flights of stairs as shown). Alternately, only a single flight 67 or 69 may be formed (not shown) in one or more individual cavities 66. An operative flight of stairs may comprise both SGD tiers and non-SGD tiers (not shown), with sub-block trenches 46 thereof extending through the SGD tiers and not through the non-SGD tiers. Regardless, cavities 66 may be formed before or after (ideal) forming channel-material strings 53. Insulative material 44 (e.g., silicon dioxide and/or silicon nitride) is within cavities 66. Sub-block trenches 46 ideally extend only into cavities 66 that comprise stair-step structures that comprise SGD tiers **22*s*. Example trenches 40 extend across stair-step region 13 and intermediate region 15 between immediately-laterally-adjacent memory blocks 58**.

Example conductive-via constructions 80 (comprising a conductive core 84 [FIG. 11] and an insulative lining 82 there-about) extend to conducting material 48 of each tread 75 of flight 67 of each sub-block 59 and are not particularly pertinent to the inventions disclosed herein. Likewise, non-SGD stair-step structures 97 have analogous conductive-via constructions 80 to each tread 75 of flight 67 also not particularly pertinent to the inventions disclosed herein. Example through-array-vias (TAVs) 90 (comprising a conductive core 84 and an insulative lining 82 per the above) are also shown and not particularly pertinent to the inventions disclosed herein.

Sub-block trenches 46 in memory-array region 12, in intermediate region 15, and in stair-step region 13 individually have a top 39 (e.g., defined by a top of material in which sub-block trenches 46 have been formed [e.g., insulative material 44 and/or 24]). In one embodiment, top 39 of individual of sub-block trenches 46 in stair-step region 13 has a narrowest-width W3 that is larger than a narrowest-width W2 of top 39 of individual sub-block trenches 46 in intermediate region 15. Further, in such one embodiment, narrowest-width W2 of top 39 of individual sub-block trenches 46 in intermediate region 15 is larger than a narrowest-width W1 of top 39 of individual sub-block trenches 46 in memory-array region 12. In one embodiment, top 39 of individual of sub-block trenches 46 in stair-step region 13 has a maximum-width that is larger than a narrowest-width W2 of top 39 of individual sub-block trenches 46 in intermediate region 15. Further, in such one embodiment, top 39 of individual sub-block trenches 46 in intermediate region 15 has a maximum-width that is larger than a narrowest-width W1 of top 39 of individual sub-block trenches 46 in memory-array region 12. If individual sub-block trenches 46 have constant width at top 39 in one or more of memory-array region 12, intermediate region 15, or stair-step region 13 (in each as shown), such respective maximum and narrowest widths in the respective region will be the same. However, if such do not have constant width at top 39 in one or more of such regions (not shown), such maximum and narrowest-width at top 39 will be different in the region(s) where such width is not constant.

In one embodiment, narrowest-width W2 of top 39 of individual sub-block trenches 46 in intermediate region 15 is 4% to 30% larger, in one such embodiment 6% to 12% larger, than narrowest-width W1 of top 39 of individual sub-block trenches 46 in memory-array region 12. In one embodiment, narrowest-width W3 of top 39 of individual sub-block trenches 46 in stair-step region 13 is 4% to 40% larger, in one such embodiment 6% to 20% larger and in one such embodiment 10% to 15% larger, than narrowest-width W2 of top 39 of individual sub-block trenches 46 in intermediate region 15.

In one embodiment, the width of top 39 of individual sub-block trenches 46 in memory-array region 12 transitions to narrowest-width W2 in memory-array region 12. In one such embodiment, narrowest-width W1 is along a width direction (e.g., 99), channel-material strings 53 in sub-blocks 59 are arrayed in individual rows 98 that are parallel the width direction, and the width of the top 39 of individual sub-block trenches 46 in memory-array region 12 transitions to narrowest-width W2 in one of rows 98. In one such embodiment and as shown, the one row 98 is not the row 98 that is most-proximate intermediate region 15, in one such embodiment and as shown is at least two rows 98 from the row 98 that is most-proximate intermediate region 15, and in one such embodiment as shown the one row 98 is five rows 98 from the row 98 that is most-proximate intermediate region 15.

The example depicted embodiment, by way of example only, shows individual sub-block trenches 46 as having only three different widths W1, W2, and W3. However, individual sub-block trenches 46 may have more different top widths (e.g., three, four, etc., dozens, etc., a hundred, etc.). Further, transitions between immediately adjacent different widths are shown as being abrupt. Alternately, such transitions may be gradual including, for example, in the absence of any abrupt transition (e.g., including being continuously gradual wherein no or few constant top width sections exist).

Top 39 in region 12, top 39 in region 15, and top 39 in region 13 may be individually planar and, if so, may be coplanar. Further, as an example, top 39 in two or more regions 12, 15, 13 may be at different elevations (heights) from conductor tier 16. Even if so, an elevation change from one such region to an immediately-adjacent such region may be abrupt (e.g., a vertical step) or gradual (e.g., straight and/or curve sloped).

Any other attribute(s) or aspect(s) as shown and/or described herein with respect to other embodiments may be used in the embodiments shown and described with reference to the above embodiments.

Embodiments of the invention encompass methods used in forming memory circuitry comprising strings of memory cells, by way of example only that incorporates device/structure as referred to above. Method embodiments may or may not incorporate, form, and/or have any of the attributes described with respect to device embodiments.

FIGS. 12-16 as one group followed by FIGS. 1-11 as another group, by way of example, may be considered as sequentially showing an example method used in forming memory circuitry comprising strings of memory cells, with FIGS. 12-16 showing predecessor structure to that of FIGS. 1-11.

Referring to FIGS. 12-16, vertically-alternating insulative tiers 20 and conductive tiers 22* have been formed and that extend from a memory-array region 12 into a stair-step region 13 across an intermediate region 15 that is between memory-array region 12 and stair-step region 13. Insulative tiers 20 and conductive tiers 22* comprise memory blocks 58 the upper portions of which individually comprise sub-block regions 59. Channel-material strings 53 extend through insulative tiers 20 and conductive tiers 22* in memory blocks 58 and sub-block regions 59.

Referring to FIGS. 1-11, sub-block trenches 46 have been etched through multiple of insulative and conductive tiers 20, 22* in the upper portions and that are individually between immediately-laterally-adjacent of sub-block regions 59 (and subsequently filled with insulating material 57). Sub-block trenches 46 in memory-array region 12, in intermediate region 15, and in stair-step region 13 individually have a top 39. In one embodiment, top 39 of individual sub-block trenches 46 in stair-step region 13 has a narrowest-width W3 that is larger than a narrowest-width W2 of top 39 of individual sub-block trenches 46 in intermediate region 15. Further in such one embodiment, narrowest-width W2 of top 39 of individual sub-block trenches 46 in intermediate region 15 is larger than a narrowest-width W1 of top 39 of individual sub-block trenches 46 in memory-array region 12. In one embodiment, top 39 of individual of sub-block trenches 46 in stair-step region 13 has a maximum-width that is larger than a narrowest-width W2 of top 39 of individual sub-block trenches 46 in intermediate region 15. Further, in such one embodiment, top 39 of individual sub-block trenches 46 in intermediate region 15 has a maximum-width that is larger than a narrowest-width W1 of top 39 of individual sub-block trenches 46 in memory-array region 12. Sub-block trenches 46 may be so etched using an etch mask (not shown) comprising, for example, photoresist and/or hard-masking material. A top surface thereof may define/have trench openings having the same W1, W2, and W3 relative relationships, albeit with W1, W2, and W3 thereof individually perhaps and likely being a little wider than W1, W2, and W3 at top 39.

Any other attribute(s) or aspect(s) as shown and/or described herein with respect to other embodiments may be used.

A challenge exists in prior analogous methods in achieving a controllable and desirable same-vertical level of and among all of the bottoms of individual sub-block trenches in the memory-array, intermediate, and stair-step regions. Where such is not achieved, under-etch may occur where the sub-block trenches have to be etched through more material than in other regions and thereby result in failed circuitry. Providing mask openings in an etch mask for etching sub-block trenches 46 that result in the example W1, W2, and W3 relationships (as a minimum) may minimize or eliminate such risk.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a method used in forming memory circuitry comprising strings of memory cells comprises forming vertically-alternating insulative tiers and conductive tiers that extend from a memory-array region into a stair-step region across an intermediate region that is between the memory-array region and the stair-step region. The insulative tiers and the conductive tiers comprise memory blocks upper portions of which individually comprise sub-block regions. Channel-material strings extend through the insulative tiers and the conductive tiers in the memory blocks and in the sub-block regions. Sub-block trenches are etched through multiple of the insulative and conductive tiers in the upper portions that are individually between immediately-laterally-adjacent of the sub-block regions. The sub-block trenches in the memory-array region, in the intermediate region, and in the stair-step region individually have a top. The top of individual of the sub-block trenches in the stair-step region has a narrowest-width that is larger than a narrowest-width of the top of the individual sub-block trenches in the intermediate region. The narrowest-width of the top of the individual sub-block trenches in the intermediate region is larger than a narrowest-width of the top of the individual sub-block trenches in the memory-array region.

In some embodiments, a method used in forming memory circuitry comprising strings of memory cells comprises forming vertically-alternating insulative tiers and conductive tiers that extend from a memory-array region into a stair-step region across an intermediate region that is between the memory-array region and the stair-step region. The insulative tiers and the conductive tiers comprise memory blocks, upper portions of which individually comprise sub-block regions. Channel-material strings extend through the insulative tiers and the conductive tiers in the memory blocks and in the sub-block regions. Sub-block trenches are etched through multiple of the insulative and conductive tiers in the upper portions that are individually between immediately-laterally-adjacent of the sub-block regions. The sub-block trenches in the memory-array region, in the intermediate region, and in the stair-step region individually have a top. The top of individual of the sub-block trenches in the stair-step region has a maximum-width that is larger than a narrowest-width of the top of the individual sub-block trenches in the intermediate region. The top of the individual sub-block trenches in the intermediate region has a maximum-width that is larger than a narrowest-width of the top of the individual sub-block trenches in the memory-array region.

In some embodiments, memory circuitry comprising strings of memory cells comprises vertically-alternating insulative tiers and conductive tiers that extend from a memory-array region into a stair-step region across an intermediate region that is between the memory-array region and the stair-step region. The insulative tiers and the conductive tiers comprise memory blocks upper portions of which individually comprise sub-blocks. Sub-block trenches are in the upper portions individually between immediately-laterally-adjacent of the sub-blocks. Strings of memory cells in the memory-array region comprise channel-material strings that extend through the insulative tiers and the conductive tiers in the memory blocks and in the sub-blocks. The sub-block trenches in the memory-array region, in the intermediate region, and in the stair-step region individually have a top. The top of individual of the sub-block trenches in the stair-step region has a narrowest-width that is larger than a narrowest-width of the top of the individual sub-block trenches in the intermediate region. The narrowest-width of the top of the individual sub-block trenches in the intermediate region is larger than a narrowest-width of the top of the individual sub-block trenches in the memory-array region.

In some embodiments, memory circuitry comprising strings of memory cells comprises vertically-alternating insulative tiers and conductive tiers that extend from a memory-array region into a stair-step region across an intermediate region that is between the memory-array region and the stair-step region. The insulative tiers and the conductive tiers comprise memory blocks upper portions of which individually comprise sub-blocks. Sub-block trenches are in the upper portions individually between immediately-laterally-adjacent of the sub-blocks. Strings of memory cells in the memory-array region comprise channel-material strings that extend through the insulative tiers and the conductive tiers in the memory blocks and in the sub-blocks. The sub-block trenches in the memory-array region, in the intermediate region, and in the stair-step region individually have a top. The top of individual of the sub-block trenches in the stair-step region has a maximum-width that is larger than a narrowest-width of the top of the individual sub-block trenches in the intermediate region. The top of individual of the sub-block trenches in the intermediate region has a maximum-width that is larger than a narrowest-width of the top of the individual sub-block trenches in the memory-array region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming memory circuitry comprising strings of memory cells, comprising:

forming vertically-alternating insulative tiers and conductive tiers that extend from a memory-array region into a stair-step region across an intermediate region that is between the memory-array region and the stair-step region, the insulative tiers and the conductive tiers comprising memory blocks upper portions of which individually comprise sub-block regions, channel-material strings that extend through the insulative tiers and the conductive tiers in the memory blocks and in the sub-block regions; and etching sub-block trenches through multiple of the insulative and conductive tiers in the upper portions that are individually between immediately-laterally-adjacent of the sub-block regions, the sub-block trenches in the memory-array region, in the intermediate region, and in the stair-step region individually having a top; the top of individual of the sub-block trenches in the stair-step region having a narrowest-width that is larger than a narrowest-width of the top of the individual sub-block trenches in the intermediate region; the narrowest-width of the top of the individual sub-block trenches in the intermediate region being larger than a narrowest-width of the top of the individual sub-block trenches in the memory-array region.

2. The method of claim 1 wherein the narrowest-width of the top of the individual sub-block trenches in the intermediate region is 4% to 30% larger than the narrowest-width of the top of the individual sub-block trenches in the memory-array region.

3. The method of claim 2 wherein the narrowest-width of the top of the individual sub-block trenches in the intermediate region is 6% to 12% larger than the narrowest-width of the top of the individual sub-block trenches in the memory-array region.

4. The method of claim 1 wherein the narrowest-width of the top of the individual sub-block trenches in the stair-step region is 4% to 40% larger than the narrowest-width of the top of the individual sub-block trenches in the intermediate region.

5. The method of claim 4 wherein the narrowest-width of the top of the individual sub-block trenches in the stair-step region is 6% to 20% larger than the narrowest-width of the top of the individual sub-block trenches in the intermediate region.

6. The method of claim 5 wherein the narrowest-width of the top of the individual sub-block trenches in the stair-step region is 10% to 15% larger than the narrowest-width of the top of the individual sub-block trenches in the intermediate region.

7. The method of claim 1 wherein, the narrowest-width of the top of the individual sub-block trenches in the intermediate region is 4% to 30% larger than the narrowest-width of the top of the individual sub-block trenches in the memory-array region; and the narrowest-width of the top of the individual sub-block trenches in the stair-step region is 4% to 40% larger than the narrowest-width of the top of the individual sub-block trenches in the intermediate region.

8. The method of claim 7 wherein the narrowest-width of the top of the individual sub-block trenches in the intermediate region is 6% to 12% larger than the narrowest-width of the top of the individual sub-block trenches in the memory-array region.

9. The method of claim 7 wherein the narrowest-width of the top of the individual sub-block trenches in the stair-step region is 6% to 20% larger than the narrowest-width of the top of the individual sub-block trenches in the intermediate region.

10. The method of claim 9 wherein the narrowest-width of the top of the individual sub-block trenches in the stair-step region is 10% to 15% larger than the narrowest-width of the top of the individual sub-block trenches in the intermediate region.

11. The method of claim 1 wherein, the narrowest-width of the top of the individual sub-block trenches in the intermediate region is 6% to 12% larger than the narrowest-width of the top of the individual sub-block trenches in the memory-array region; and the narrowest-width of the top of the individual sub-block trenches in the stair-step region is 6% to 20% larger than the narrowest-width of the top of the individual sub-block trenches in the intermediate region.

12. The method of claim 11 wherein the narrowest-width of the top of the individual sub-block trenches in the stair-step region is 10% to 15% larger than the narrowest-width of the top of the individual sub-block trenches in the intermediate region.

13. The method of claim 1 wherein the width of the top of the individual sub-block trenches in the memory-array region transitions to the narrowest-width of the top of the individual sub-block trenches in the memory-array region.

14. The method of claim 13 wherein the narrowest-width of the top of the individual sub-block trenches in the memory-array region is along a width direction, the channel-material strings in the sub-block regions being arrayed in individual rows that are parallel the width direction, the width of the top of the individual sub-block trenches in the memory-array region transitions to the narrowest-width of the top of the individual sub-block trenches in one of the rows.

15. The method of claim 14 wherein the one row is not the row that is most-proximate the intermediate region.

16. The method of claim 15 wherein the one row is at least two of the rows from the row that is most-proximate the intermediate region.

17. The method of claim 16 wherein the one row is five of the rows from the row that is most-proximate the intermediate region.

18. A method used in forming memory circuitry comprising strings of memory cells, comprising:

forming vertically-alternating insulative tiers and conductive tiers that extend from a memory-array region into a stair-step region across an intermediate region that is between the memory-array region and the stair-step region, the insulative tiers and the conductive tiers comprising memory blocks upper portions of which individually comprise sub-block regions, channel-material strings that extend through the insulative tiers and the conductive tiers in the memory blocks and in the sub-block regions; and etching sub-block trenches through multiple of the insulative and conductive tiers in the upper portions that are individually between immediately-laterally-adjacent of the sub-block regions, the sub-block trenches in the memory-array region, in the intermediate region, and in the stair-step region individually having a top; the top of individual of the sub-block trenches in the stair-step region having a maximum-width that is larger than a narrowest-width of the top of the individual sub-block trenches in the intermediate region; the top of the individual sub-block trenches in the intermediate region having a maximum-width that is larger than a narrowest-width of the top of the individual sub-block trenches in the memory-array region.

19. Memory circuitry comprising strings of memory cells, comprising:

vertically-alternating insulative tiers and conductive tiers that extend from a memory-array region into a stair-step region across an intermediate region that is between the memory-array region and the stair-step region, the insulative tiers and the conductive tiers comprising memory blocks upper portions of which individually comprise sub-blocks, sub-block trenches in the upper portions that are individually between immediately-laterally-adjacent of the sub-blocks, strings of memory cells in the memory-array region comprising channel-material strings that extend through the insulative tiers and the conductive tiers in the memory blocks and in the sub-blocks; and the sub-block trenches in the memory-array region, in the intermediate region, and in the stair-step region individually having a top; the top of individual of the sub-block trenches in the stair-step region having a narrowest-width that is larger than a narrowest-width of the top of the individual sub-block trenches in the intermediate region; the narrowest-width of the top of the individual sub-block trenches in the intermediate region being larger than a narrowest-width of the top of the individual sub-block trenches in the memory-array region.

20. The memory circuitry of claim 19 wherein the narrowest-width of the top of the individual sub-block trenches in the intermediate region is 4% to 30% larger than the narrowest-width of the top of the individual sub-block trenches in the memory-array region.

21. The memory circuitry of claim 20 wherein the narrowest-width of the top of the individual sub-block trenches in the intermediate region is 6% to 12% larger than the narrowest-width of the top of the individual sub-block trenches in the memory-array region.

22. The memory circuitry of claim 19 wherein the narrowest-width of the top of the individual sub-block trenches in the stair-step region is 4% to 40% larger than the narrowest-width of the top of the individual sub-block trenches in the intermediate region.

23. The memory circuitry of claim 22 wherein the narrowest-width of the top of the individual sub-block trenches in the stair-step region is 6% to 20% larger than the narrowest-width of the top of the individual sub-block trenches in the intermediate region.

24. The memory circuitry of claim 23 wherein the narrowest-width of the top of the individual sub-block trenches in the stair-step region is 10% to 15% larger than the narrowest-width of the top of the individual sub-block trenches in the intermediate region.

25. The memory circuitry of claim 19 wherein, the narrowest-width of the top of the individual sub-block trenches in the intermediate region is 4% to 30% larger than the narrowest-width of the top of the individual sub-block trenches in the memory-array region; and the narrowest-width of the top of the individual sub-block trenches in the stair-step region is 4% to 40% larger than the narrowest-width of the top of the individual sub-block trenches in the intermediate region.

26. The memory circuitry of claim 25 wherein the narrowest-width of the top of the individual sub-block trenches in the intermediate region is 6% to 12% larger than the narrowest-width of the top of the individual sub-block trenches in the memory-array region.

27. The memory circuitry of claim 25 wherein the narrowest-width of the top of the individual sub-block trenches in the stair-step region is 6% to 20% larger than the narrowest-width of the top of the individual sub-block trenches in the intermediate region.

28. The memory circuitry of claim 27 wherein the narrowest-width of the top of the individual sub-block trenches in the stair-step region is 10% to 15% larger than the narrowest-width of the top of the individual sub-block trenches in the intermediate region.

29. The memory circuitry of claim 19 wherein, the narrowest-width of the top of the individual sub-block trenches in the intermediate region is 6% to 12% larger than the narrowest-width of the top of the individual sub-block trenches in the memory-array region; and the narrowest-width of the top of the individual sub-block trenches in the stair-step region is 6% to 20% larger than the narrowest-width of the top of the individual sub-block trenches in the intermediate region.

30. The memory circuitry of claim 29 wherein the narrowest-width of the top of the individual sub-block trenches in the stair-step region is 10% to 15% larger than the narrowest-width of the top of the individual sub-block trenches in the intermediate region.

31. The memory circuitry of claim 19 wherein the width of the top of the individual sub-block trenches in the memory-array region transitions to the narrowest-width of the top of the individual sub-block trenches in the memory-array region.

32. The memory circuitry of claim 31 wherein the narrowest-width of the top of the individual sub-block trenches in the memory-array region is along a width direction, the channel-material strings in the sub-blocks being arrayed in individual rows that are parallel the width direction, the width of the top of the individual sub-block trenches in the memory-array region transitions to the narrowest-width of the top of the individual sub-block trenches in one of the rows.

33. The memory circuitry of claim 32 wherein the one row is not the row that is most-proximate the intermediate region.

34. The memory circuitry of claim 33 wherein the one row is at least two of the rows from the row that is most-proximate the intermediate region.

35. The memory circuitry of claim 34 wherein the one row is five of the rows from the row that is most-proximate the intermediate region.

36. Memory circuitry comprising strings of memory cells, comprising:

vertically-alternating insulative tiers and conductive tiers that extend from a memory-array region into a stair-step region across an intermediate region that is between the memory-array region and the stair-step region, the insulative tiers and the conductive tiers comprising memory blocks upper portions of which individually comprise sub-blocks, sub-block trenches in the upper portions that are individually between immediately-laterally-adjacent of the sub-blocks, strings of memory cells in the memory-array region comprising channel-material strings that extend through the insulative tiers and the conductive tiers in the memory blocks and in the sub-blocks; and the sub-block trenches in the memory-array region, in the intermediate region, and in the stair-step region individually having a top; the top of individual of the sub-block trenches in the stair-step region having a maximum-width that is larger than a narrowest-width of the top of the individual sub-block trenches in the intermediate region; the top of individual of the sub-block trenches in the intermediate-region region having a maximum-width that is larger than a narrowest-width of the top of the individual sub-block trenches in the memory-array region.

* * * * *